United States Patent
Long et al.

(10) Patent No.: US 12,261,029 B2
(45) Date of Patent: Mar. 25, 2025

(54) PROTECTION SYSTEM FOR SWITCHES IN DIRECT DRIVE CIRCUITS OF SUBSTRATE PROCESSING SYSTEMS

(71) Applicant: Lam Research Corporation, Fremont, CA (US)

(72) Inventors: Maolin Long, Santa Clara, CA (US); Yuhou Wang, Fremont, CA (US); Michael John Martin, Union City, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 61 days.

(21) Appl. No.: 18/009,575

(22) PCT Filed: Jun. 10, 2021

(86) PCT No.: PCT/US2021/036827
§ 371 (c)(1),
(2) Date: Dec. 9, 2022

(87) PCT Pub. No.: WO2021/257374
PCT Pub. Date: Dec. 23, 2021

(65) Prior Publication Data
US 2023/0245873 A1    Aug. 3, 2023

Related U.S. Application Data (60) Provisional application No. 63/040,325, filed on Jun. 17, 2020.

(51) Int. Cl.
| | |
|---|---|
| H01J 37/32 | (2006.01) |
| G01R 27/08 | (2006.01) |
| H02J 50/20 | (2016.01) |

(52) U.S. Cl.
CPC ........ H01J 37/32935 (2013.01); G01R 27/08 (2013.01); H01J 37/32082 (2013.01); *H02J 50/20* (2016.02)

(58) Field of Classification Search
CPC .......... H01J 37/32935; H01J 37/32082; H01J 37/32174; G01R 27/08; H02J 50/20;
(Continued)

(56) References Cited

U.S. PATENT DOCUMENTS 11,834,204 B1 * 12/2023 Gorokhovsky ....... F03H 1/0043
2003/0150710 A1    8/2003 Evans et al.
(Continued)

FOREIGN PATENT DOCUMENTS

KR    10-2013-0139377 A    12/2013

OTHER PUBLICATIONS

Notification of Transmittal of the ISR & Written Opinion PCT/US2021/036827, and the Written Opinion, dated Sep. 30, 2021.

*Primary Examiner* — Abdullah A Riyami
*Assistant Examiner* — Syed M Kaiser
(74) *Attorney, Agent, or Firm* — PENILLA IP, APC (57) ABSTRACT

A direct drive system for providing RF power to a component of a substrate processing system includes a direct drive circuit including a switch and configured to supply RF power to the component. A switch protection module is configured to monitor a load current and a load voltage in a processing chamber, calculate load resistance based on the load current and the load voltage, compare the load resistance to a first predetermined load resistance, and adjust at least one of an RF power limit and an RF current limit of the direct drive circuit based on the comparison.

24 Claims, 7 Drawing Sheets

(58) Field of Classification Search
CPC ..... Y02B 70/10; H03K 17/0822; H02M 1/32; H02M 1/42; H02M 3/01; H02M 3/1584; H02M 7/538; H02M 3/1555
See application file for complete search history.

(56) References Cited

U.S. PATENT DOCUMENTS

| | | |
|---|---|---|
| 2004/0263412 A1 | 12/2004 | Pribyl |
| 2005/0270118 A1 | 12/2005 | Shannon |
| 2007/0139122 A1 | 6/2007 | Nagarkatti et al. |
| 2007/0257743 A1 | 11/2007 | Shannon |
| 2007/0262723 A1 | 11/2007 | Ikenouchi |
| 2008/0179948 A1 | 7/2008 | Nagarkatti et al. |
| 2010/0231296 A1* | 9/2010 | Nagarkatti ................ H03F 1/56 330/192 |
| 2012/0262064 A1 | 10/2012 | Nagarkatti et al. |
| 2014/0097751 A1* | 4/2014 | Thomas ................... H05H 1/46 315/111.21 |
| 2015/0313000 A1 | 10/2015 | Thomas et al. |

\* cited by examiner

PROTECTION SYSTEM FOR SWITCHES IN DIRECT DRIVE CIRCUITS OF SUBSTRATE PROCESSING SYSTEMS

CLAIM OF PRIORITY

This application is a national stage filing of and claims priority, under 35 U.S.C. § 371, to PCT/US21/36827, filed on Jun. 10, 2021, and titled "Protection System for Switches in Direct Drive Circuits of Substrate Processing Systems", which claims the benefit of and priority, under 35 U.S.C. § 119 (e), to U.S. Provisional Patent Application No. 63/040,325, filed on Jun. 17, 2020, and titled "Protection System for Switches in Direct Drive Circuits of Substrate Processing Systems", all of which are incorporated by reference herein in their entirety.

FIELD

The present disclosure relates to substrate processing systems, and more particularly to drive circuits for supplying RF plasma power or an RF bias in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to etch thin film on substrates such as semiconductor wafers. Etching usually includes either wet chemical etching or dry etching. Dry etching may be performed using plasma generated by inductively-coupled plasma (ICP). The inductively-coupled plasma may be generated by coils arranged outside of a processing chamber adjacent to a dielectric window. Process gas flowing inside the processing chamber is ignited to create plasma. In some applications, RF plasma power is output to one or more inductive coils that are arranged outside of the processing chamber. RF bias power may also be supplied to an electrode in the substrate support.

The frequency of the RF plasma power or RF bias power can be varied to provide additional process control. In addition, a magnitude or level of the RF plasma power or the RF bias power can be varied during processing to provide additional process control. Changes in the RF plasma power or level and/or the RF bias power or level can cause changes in the impedance seen by the drive circuit. When an impedance mismatch occurs between the load and the drive circuit, power is reflected, which is inefficient.

SUMMARY

A direct drive system for providing RF power to a component of a substrate processing system includes a direct drive circuit including a switch and configured to supply RF power to the component. A switch protection module is configured to monitor a load current and a load voltage in a processing chamber, calculate load resistance based on the load current and the load voltage, compare the load resistance to a first predetermined load resistance, and adjust at least one of an RF power limit and an RF current limit of the direct drive circuit based on the comparison.

In other features, a voltage/current (VI) probe is arranged in the processing chamber and configured to generate the load current and load voltage. The first predetermined load resistance is selected based on a resistance during at least one non-plasma condition. The at least one non-plasma condition corresponds to plasma failing to ignite. The at least one non-plasma condition corresponds to plasma dropping out after process gas flow to the process chamber is turned off.

In other features, the switch protection module reduces the at least one of the RF power limit and the RF current limit of the direct drive circuit in response to the load resistance being less than or equal to a first predetermined load resistance. The switch protection module is configured to shut down the direct drive circuit in response to the load resistance being less than or equal to the first predetermined load resistance for a period greater than a predetermined period. The switch protection module increases the at least one of the RF power limit and the RF current limit of the direct drive circuit in response to the load resistance being less than or equal to a first predetermined load resistance.

In other features, the switch protection module is configured to shut down the direct drive circuit in response to the load resistance being less than or equal to the first predetermined load resistance for a period greater than a predetermined period.

In other features, the switch protection module selects at least one of a first RF power limit and a first RF current limit of the direct drive circuit in response to the load resistance being less than or equal to a first predetermined load resistance and at least one of a second RF power limit and a second RF current limit of the direct drive circuit in response to the load resistance being greater than the first predetermined load resistance. The at least one of a first RF power limit and the first RF current limit of the direct drive circuit is less than the at least one of the second RF power limit and the second RF current limit of the direct drive circuit, respectively. The switch protection module is configured to shut down the direct drive circuit in response to the load resistance being less than or equal to the first predetermined load resistance for a period greater than a predetermined period.

In other features, the switch protection module selects at least one of a first RF power limit and a first RF current limit of the direct drive circuit in response to the load resistance being less than or equal to a first predetermined load resistance and at least one of a second RF power limit and a second RF current limit of the direct drive circuit in response to the load resistance being greater than the first predetermined load resistance. The at least one of a first RF power limit and the first RF current limit of the direct drive circuit is greater than the at least one of the second RF power limit and the second RF current limit of the direct drive circuit, respectively. The switch protection module is configured to shut down the direct drive circuit in response to the load resistance being less than or equal to the first predetermined load resistance for a period greater than a predetermined period.

In other features, the switch protection module is configured to shut down the direct drive circuit in response to the load resistance being less than or equal to the first predetermined load resistance for a period greater than a predetermined period. The direct drive circuit includes a clock generator to generate a clock signal at a first frequency and a gate driver to receive the clock signal. A bridge circuit includes a first switch with a control terminal connected to the gate driver, a first terminal and a second terminal. A second switch with a control terminal connected to the gate driver, a first terminal connected to the second terminal of the first switch and an output node, and a second terminal.

In other features, a current sensor senses current at the output node and to generate a current signal. A voltage sensor senses voltage at the output node and to generate a voltage signal. A controller includes a phase offset calculating module to calculate a phase offset between the voltage signal and the current signal and a clock adjusting module to adjust the first frequency based on the phase offset. The component comprises a coil arranged outside of the processing chamber.

A method for providing RF power to a component of a substrate processing system includes supplying RF power to the component using a direct drive circuit including a switch; monitoring a load current and a load voltage in a processing chamber; calculating load resistance based on the load current and the load voltage; comparing the load resistance to a first predetermined load resistance; and adjusting at least one of an RF power limit and an RF current limit of the direct drive circuit based on the comparison.

In other features, the method includes arranging a voltage/current (VI) probe in the processing chamber and generating the load current and load voltage using the VI probe. The first predetermined load resistance is selected based on a resistance during at least one non-plasma condition. The at least one non-plasma condition corresponds to plasma failing to ignite.

The at least one non-plasma condition corresponds to plasma dropping out after process gas flow to the process chamber is turned off.

In other features, the method includes reducing the at least one of the RF power limit and the RF current limit of the direct drive circuit in response to the load resistance being less than or equal to a first predetermined load resistance. The method includes shutting down the direct drive circuit in response to the load resistance being less than or equal to the first predetermined load resistance for a period greater than a predetermined period.

In other features, the method includes increasing the at least one of the RF power limit and the RF current limit of the direct drive circuit in response to the load resistance being less than or equal to a first predetermined load resistance. The method includes shutting down the direct drive circuit if the load resistance is less than the first predetermined load resistance for a period greater than a predetermined period.

In other features, the method includes selecting at least one of a first RF power limit and a first RF current limit of the direct drive circuit in response to the load resistance being less than or equal to a first predetermined load resistance and at least one of a second RF power limit and a second RF current limit of the direct drive circuit in response the load resistance being greater than the first predetermined load resistance. The at least one of a first RF power limit and the first RF current limit of the direct drive circuit is less than the at least one of the second RF power limit and the second RF current limit of the direct drive circuit, respectively. The method includes shutting down the direct drive circuit in response to the load resistance being less than the first predetermined load resistance for a period greater than a predetermined period.

In other features, the method includes selecting at least one of a first RF power limit and a first RF current limit of the direct drive circuit in response to the load resistance being less than or equal to a first predetermined load resistance and at least one of a second RF power limit and a second RF current limit of the direct drive circuit in response to the load resistance being greater than the first predetermined load resistance. The at least one of a first RF power limit and the first RF current limit of the direct drive circuit is greater than the at least one of the second RF power limit and the second RF current limit of the direct drive circuit, respectively. The method includes shutting down the direct drive circuit in response to the load resistance being less than or equal to the first predetermined load resistance for a period greater than a predetermined period.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In some applications, a frequency of the RF source power supplied to the ICP coil and/or an RF bias to an electrode in the substrate support is switched between two or more frequencies and/or two or more pulsing levels. In these systems, an impedance of an RF generator is matched to a load (such as the inductive coils and the plasma or the electrode and the plasma). However, the impedance of the load changes as the plasma conditions vary, the pulsing level changes, and/or due to various other factors. When impedance mismatch occurs, power is reflected by the load, which is inefficient. Tuning of the circuits using variable capacitors is difficult due to the amount of time that is required to change the value of the capacitance relative to the switching period between frequency changes and/or level to level changes.

To eliminate some of the problems identified above, direct drive circuits including switches have been used to supply RF power instead of an RF source and matching network. Examples of direct drive and hybrid direct drive circuits are shown and described in commonly-assigned U.S. Pat. No. 10,515,781, which is hereby incorporated by reference in its entirety. Direct drive circuits operate at low impedance, which eliminates the matching problems described above.

The switches in the direct drive circuits may fail during non-plasma conditions such as when plasma does not ignite or when plasma drops out after gas flows are turned off. RF current limits and dissipation limits have been used to protect the direct drive circuits. However, RF current limits alone have not resolved switch failures at higher RF frequencies such as 13 MHz. While reduced dissipation limits may prevent switch failure, they have also unacceptably reduced the operating window. In addition, dissipation limits are not well understood and have insufficient accuracy.

Systems and methods according to the present disclosure monitor load voltage and current during operation of the direct drive circuit using a voltage (V) and current (I) probe (VI probe) arranged in the processing chamber. Load resistance is calculated based on the measured voltage and current and is compared to a predetermined resistance threshold. In some examples, when the measured load resistance is less than the predetermined resistance threshold, a switch protection module alters operation of the direct drive circuit. More particularly, when the load resistance is below a predetermined resistance threshold, reduced RF power limits and/or RF current limits are applied until load resistance changes. The load resistance increases when a transition from non-plasma conditions to plasma on conditions occurs.

In another example, when the load resistance is below a predetermined resistance threshold during non-plasma conditions, increased RF power limits and/or RF current limits are applied for a predetermined period to attempt to strike plasma. This approach is counter-intuitive since the usual way to protect the switches is to reduce power. However, if plasma is struck in response to the higher RF power and/or current limits, the load resistance will generally increase due to the transition from non-plasma conditions to plasma on conditions occurs.

After plasma is on, the power limits and/or current limits can be increased (when the limits are reduced due to low load resistance) or decreased (when the limits are increased due to low load resistance). In some examples, when the low load resistance condition lasts for a predetermined period of time, the system sends an error message (or triggers an alarm) and shuts off output RF power from the direct drive circuit.

Figures 1A, 1B:
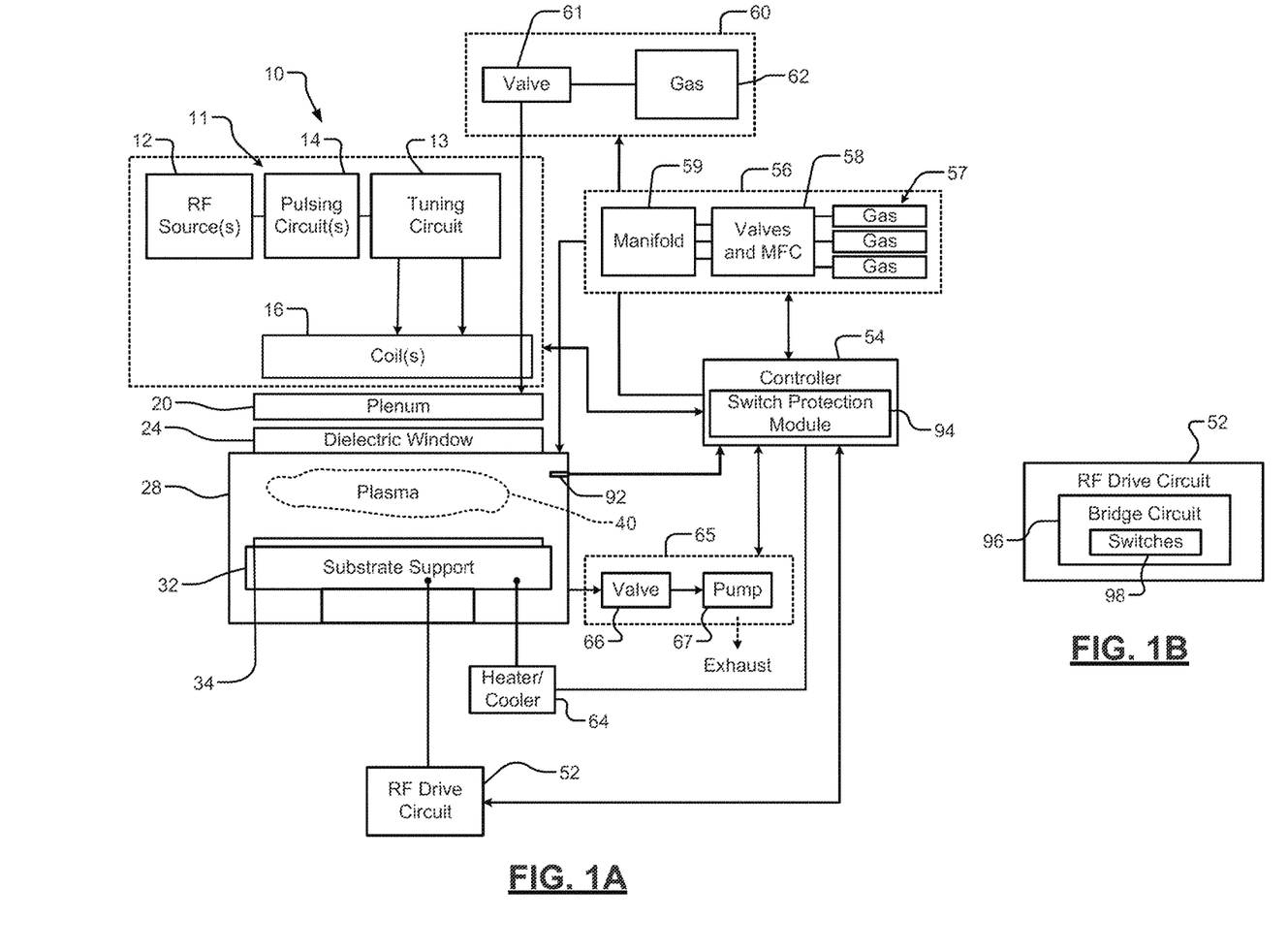
FIG. 1A is a functional block diagram of an example of a substrate processing system including one or more direct drive systems according to the present disclosure.
FIG. 1B is a functional block diagram of an example of a direct drive system including a switch protection module and a direct drive circuit with switches according to the present disclosure.

Referring now to FIGS. 1A and 1B, an example of a substrate processing system 10 according to the present disclosure is shown. The substrate processing system 10 includes one or more RF direct drive systems 52 described further below.

In some examples, a plenum 20 may be arranged between the coils 16 and a dielectric window 24 to control the temperature of the dielectric window 24 with hot and/or cold air flow. The dielectric window 24 is arranged along one side of a processing chamber 28. The processing chamber 28 further comprises a substrate support (or pedestal) 32. The substrate support 32 may include an electrostatic chuck (ESC), or a mechanical chuck or other type of chuck.

Process gas is supplied to the processing chamber 28 and plasma 40 is generated inside of the processing chamber 28. The plasma 40 etches an exposed surface of the substrate 34. Another RF direct drive system 52 (such as those described further below) may also be used to provide an RF bias to an electrode in the substrate support 32 during operation.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas delivery system 60 may be used to deliver gas 62 via a valve 61 to the plenum 20. The gas may include cooling gas (air) that is used to cool the coils 16 and the dielectric window 24. A heater/cooler 64 may be used to heat/cool the substrate support 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, supply of cooling gas, and so on.

A VI probe 92 is arranged in the processing chamber and senses load voltage and current. As can be seen in FIG. 1B, the direct drive system 52 includes a controller 93 with a switch protection module 94. In some examples, the controllers 54 and 93 can be combined. A direct drive circuit 95 includes a bridge circuit 96 and switches 98. The switch protection module 94 protects the switches 98 by calculating a load resistance based on the load voltage and load current and then adjusting operation of the direct drive system 52 based on the load resistance. More particularly, the switch protection module 94 compares the load resistance to a predetermined resistance threshold. When the measured load resistance is less than the predetermined resistance threshold, the switch protection module 94 alters operation of the direct drive circuit 95.

In some examples, when load resistance is below a predetermined resistance threshold, reduced RF power limits and/or RF current limits are applied until the load resistance increases. The load resistance increases due to a transition from non-plasma conditions to plasma on conditions. In other examples, when load resistance is below a predetermined resistance threshold, increased RF power limits and/or RF current limits are applied until the load resistance increases due to plasma conditions. The direct drive system 52 includes a bridge circuit 96 and one or more switches that are modulated to generate RF power.

Figure 2:
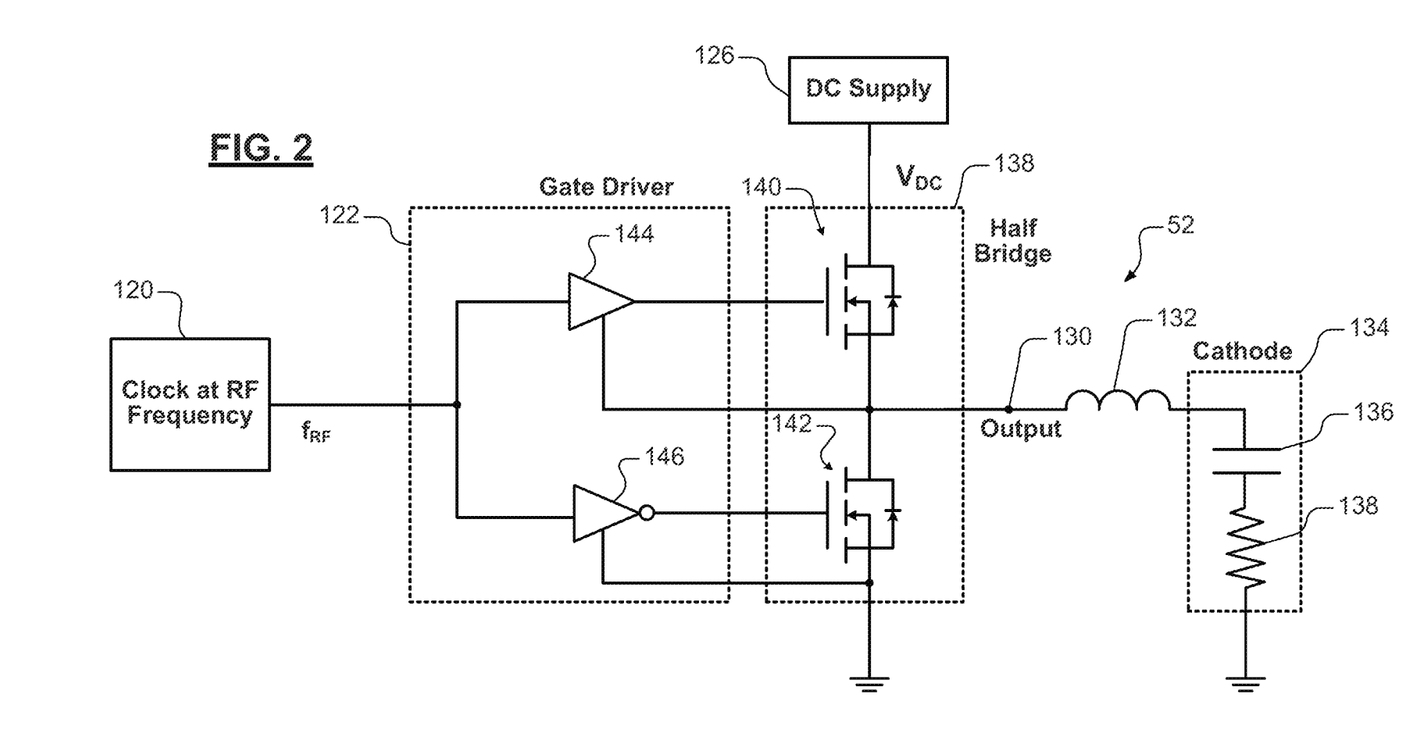
FIG. 2 is a functional block diagram of an example of a direct drive circuit including switches according to the present disclosure.

Referring now to FIG. 2, an example of the direct drive circuit 95 for supplying the RF bias (or the RF plasma power) is shown. The direct drive circuit 95 includes a clock 120 that operates at one or more selected RF frequencies. The clock signal output by the clock 120 is input to a gate driver circuit 122. In some examples, the gate driver circuit 122 includes an amplifier 144 and an inverting amplifier 146 having respective inputs connected to the clock 120.

Outputs of the gate driver circuit 122 is input to a bridge circuit 138. In some examples, the bridge circuit 138 includes a first switch 140 and a second switch 142 (corresponding to the switches 98 to be protected). In some examples, the first switch 140 and the second switch 142 include metal oxide semiconductor field effect transistors (MOSFETs). The first switch 140 and the second switch 142 each include a control terminal, and first and second terminals. An output of the amplifier 144 of the gate driver circuit 122 is input to the control terminal of the first switch 140.

An output of the inverting amplifier 146 of the gate driver circuit 122 is input to the control terminal of the second switch 142.

An output node 130 is connected to the second terminal of the first switch 140 and to the first terminal of the second switch 142. The first terminal of the first switch 140 is connected to the DC supply 126. The second terminal of the second switch 142 is connected to a reference potential such as ground. The output node 130 is connected by a capacitor 132 to a coil or inductor.

The direct drive circuit in FIG. 2 uses a single DC supply 126 that can produce undesired DC voltage/component on a base plate of the ESC. This DC component can complicate the wafer chucking/dechucking performance by affecting the ESC DC bias on the base plate that is expected to be independently controlled.

Figure 3:
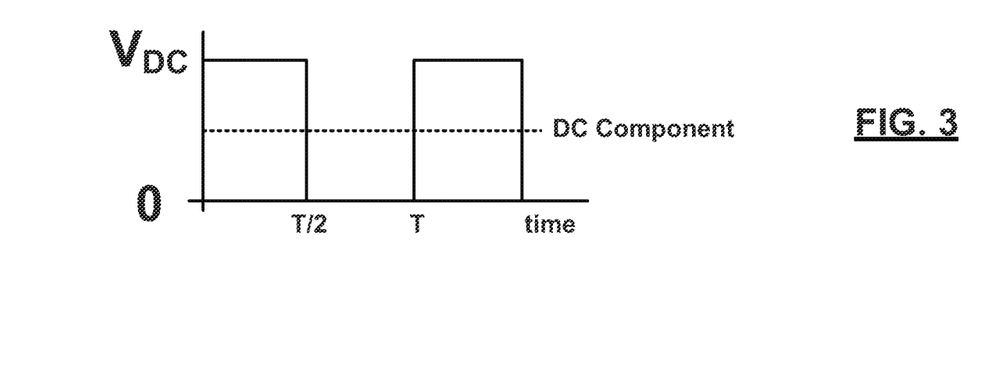
FIG. 3 is a graph illustrating output voltage as a function of time for the direct drive circuit in FIG. 2.

Referring now to FIG. 3, a Fourier transform of the voltage waveform at the output node 130 of the bridge circuit 138 in FIG. 2 can be expressed in equation form as:

$$v(t) = \frac{V_{DC}}{2} + \sum_{k=1,3,5,...}^{\infty} \left(\frac{2V_{DC}}{k\pi}\sin(2\pi kt/T)\right)$$

where $T=1/f_{RF}$ and $f_{RF}$ is the RF frequency. When the harmonics on the right hand side of equation are filtered using a low pass filter, the fundamental frequency at $f_{RF}$ and the DC component of $V_{DC/2}$ remain.

Figure 4:
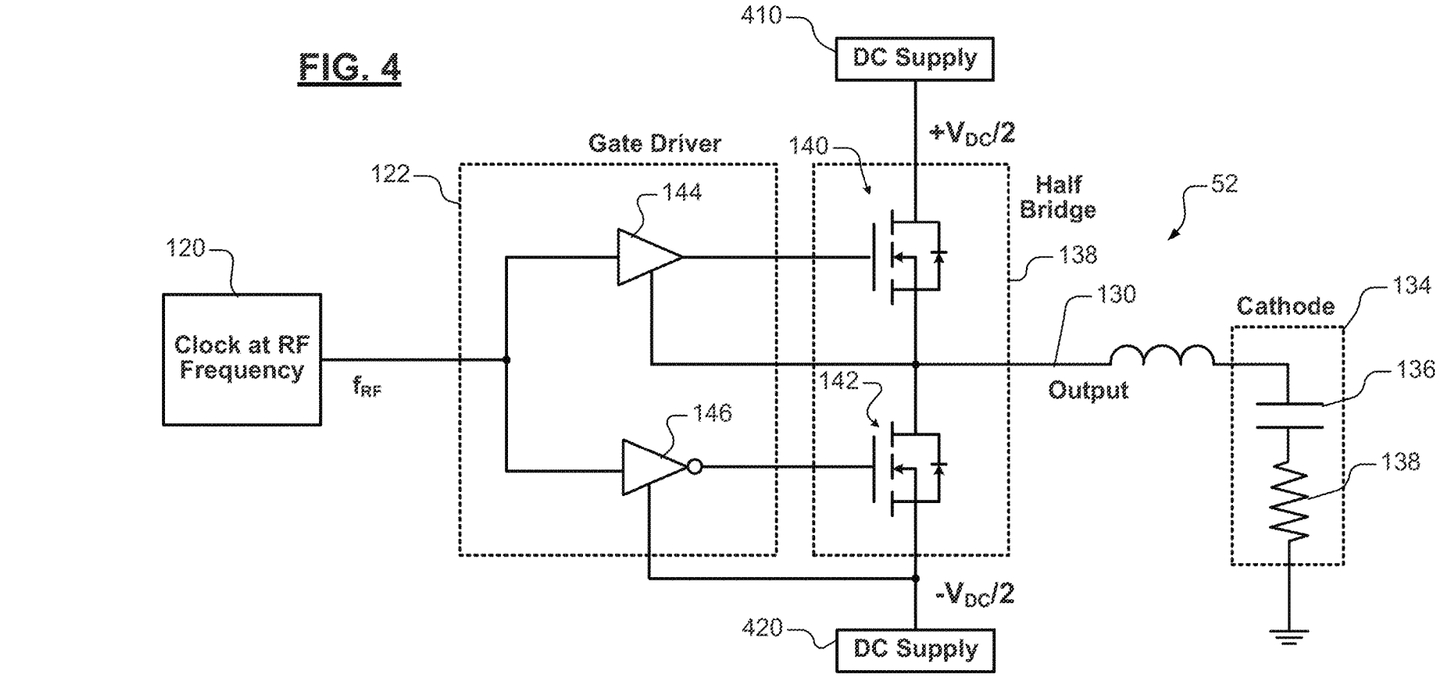
FIG. 4 is a functional block diagram of another example of a direct drive circuit.

Referring now to FIG. 4, to resolve the undesired DC voltage on the base plate, the direct drive circuit 95 may use dual DC supplies. The direct drive circuit 95 includes a first DC supply 410 operating at $+V_{DC/2}$ and a second DC supply 420 operating at $-V_{DC/2}$. To achieve the same output RF power, both the first and second DC supplies 410, 420 operate at half the voltage of the single DC supply in FIG. 2. In some examples, the first DC supply 410 and the second DC supply 420 operate at approximately the same magnitude and opposite polarity. As used herein, approximately the same refers to a difference between a magnitude of the DC voltage output by the first DC supply 410 relative to the second DC supply 420 that is less than 10%, 5% or 1%. The first DC supply 410 is connected to the first terminal of the first switch 140. The second DC supply 420 is connected to the second terminal of the second switch 142.

Figure 5:
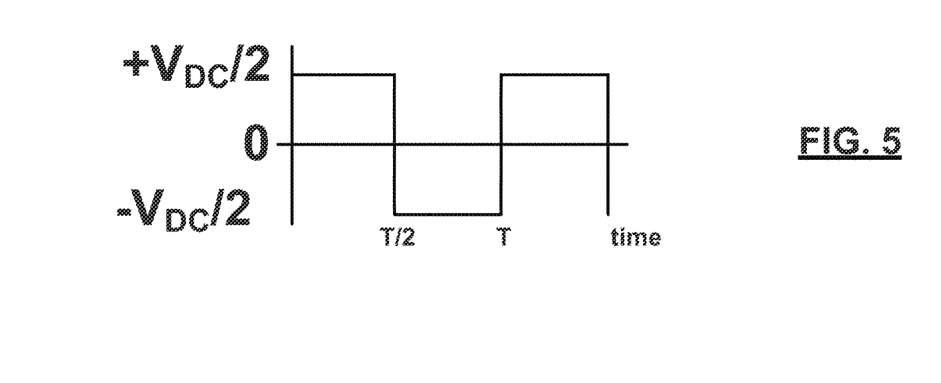
FIG. 5 is a graph illustrating output voltage as a function of time for the direct drive circuit in FIG. 4.

Referring now to FIG. 5, the voltage waveform output by the direct drive circuit 95 in FIG. 4 has no DC component with the following Fourier transform:

$$v(t) = \sum_{k=1,3,5,...}^{\infty} \left(\frac{2V_{DC}}{k\pi}\sin(2\pi kt/T)\right)$$

where $T=1/f_{RF}$ and $f_{RF}$ is the RF frequency. Therefore, there is no DC component as in the circuit of FIG. 2, which eliminates the problems associated therewith.

Figure 6:
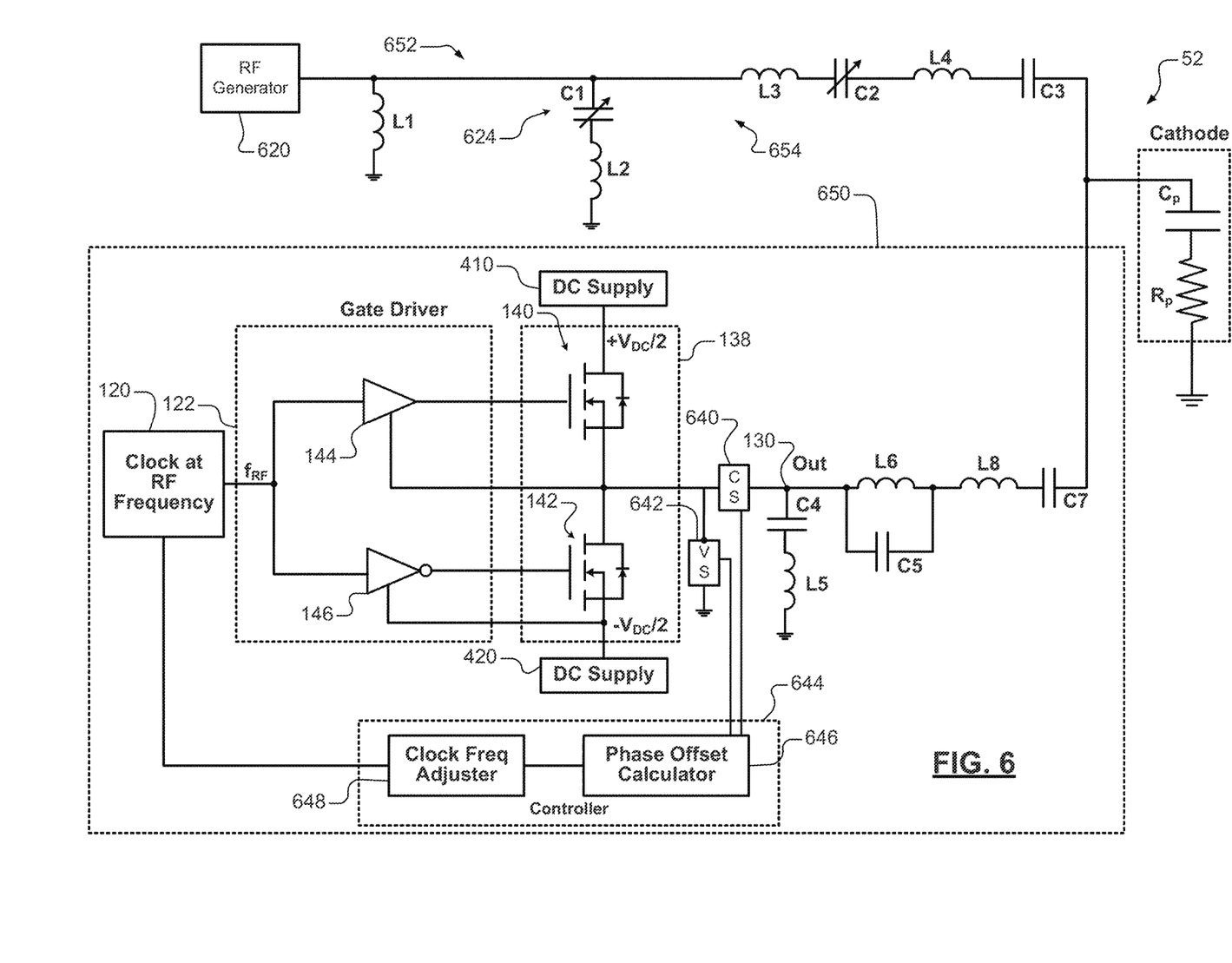
FIG. 6 is a functional block diagram of another example of a direct drive circuit.

Referring now to FIG. 6, the direct drive circuit 95 includes the clock 120, the gate driver circuit 122, the bridge circuit 138, the first DC supply 410 and the second DC supply 420 as described above. The output node 130 is connected by the capacitor 132 to the coil.

A current sensor 640 is connected to the output node 130. Likewise, a voltage sensor 642 is connected to the output node 130. Sensed current output by current sensor 640 and sensed voltage output by the voltage sensor 642 are input to a controller 644 including a phase offset calculating module 646 and a clock frequency adjusting module 648.

The phase offset calculating module 646 determines the phase offset between the voltage and current. The phase offset calculating module 646 outputs the phase offset to a clock frequency adjusting module 648. When the voltage leads the current, the clock frequency adjusting module 648 decreases the frequency of the clock 120. When the current leads the voltage, the clock frequency adjusting module 648 increases the frequency of the clock 120. In some examples, hysteresis may be used. In some examples, the clock frequency adjusting module 648 decreases the frequency of the clock 120 when the voltage leads the current by a predetermined first threshold TH1. In some examples, the clock frequency adjusting module 648 decreases the frequency of the clock 120 when the voltage leads the current by a predetermined second threshold TH2.

Figure 7:
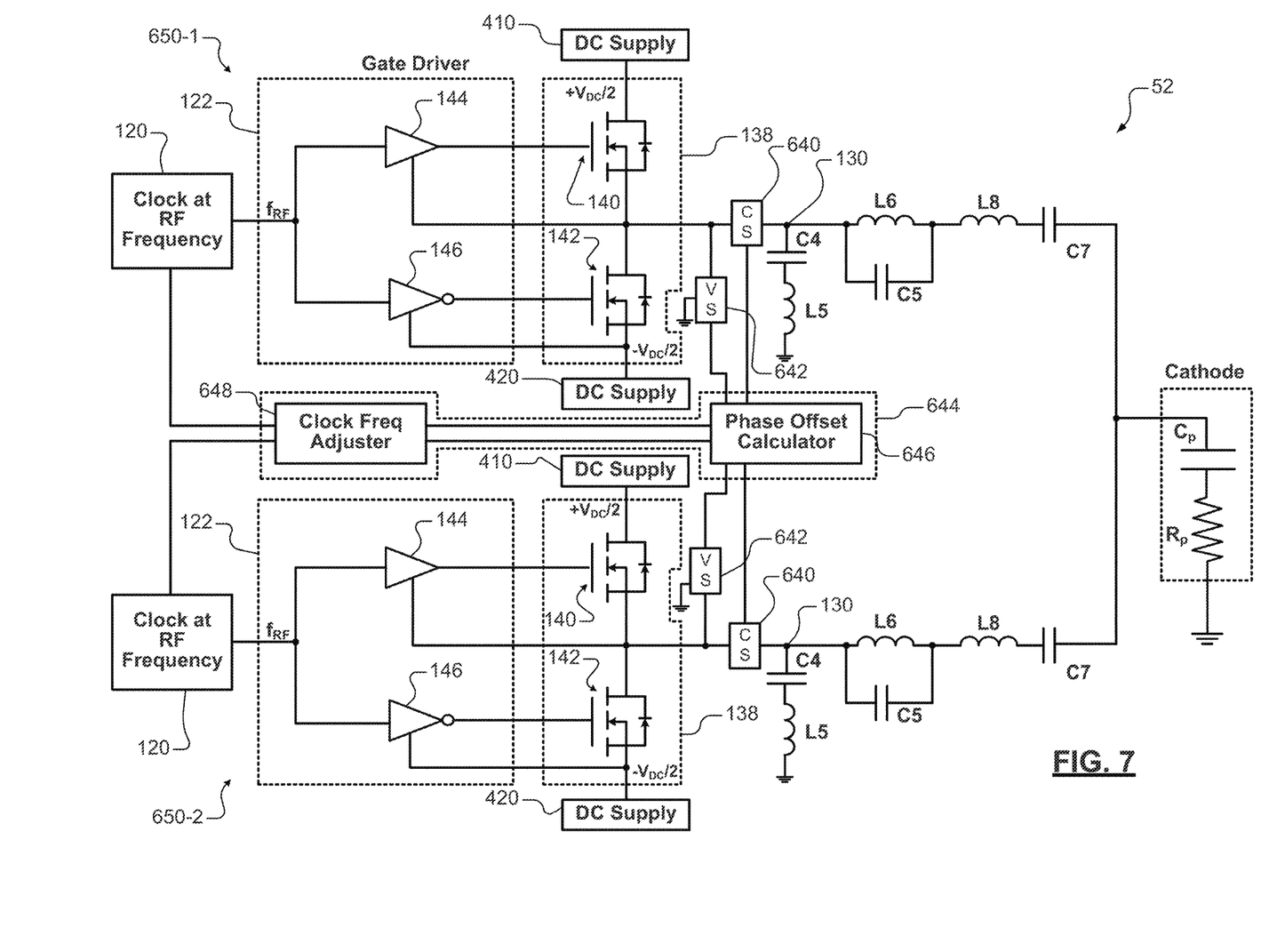
FIGS. 7 and 8 are flowcharts of examples of methods for adjusting a frequency of the clock generator based on the phase offset.

Referring now to FIG. 7, a method 700 for controlling the direct drive circuit is shown. At 710, current and voltage waveforms are sensed at the output node or another location. At 714, a phase offset is determined between the voltage and current waveforms. For example, zero crossings of the current and voltage can be monitored. A difference in timing of the zero crossings can be used to determine the phase offset. At 720, a frequency of the clock is adjusted to reduce phase offset between the voltage and current.

Figure 8:
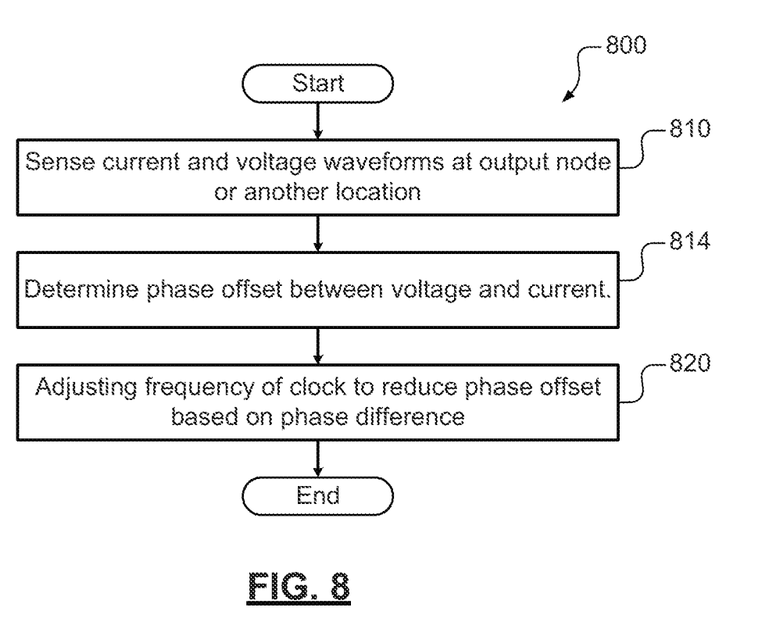

Referring now to FIG. 8, a method 800 for adjusting the frequency of the clock is shown. When the voltage leads the current as determined at 810, the frequency is reduced at 820. In some examples, the voltage needs to lead the current by more than a first threshold TH1 before the frequency is reduced. When the current leads the voltage as determined at 830, the frequency is increased at 840. In some examples, the current needs to lead the voltage by more than a second threshold TH2 before the frequency is increased. In other examples, hysteresis is not used.

Figure 9:
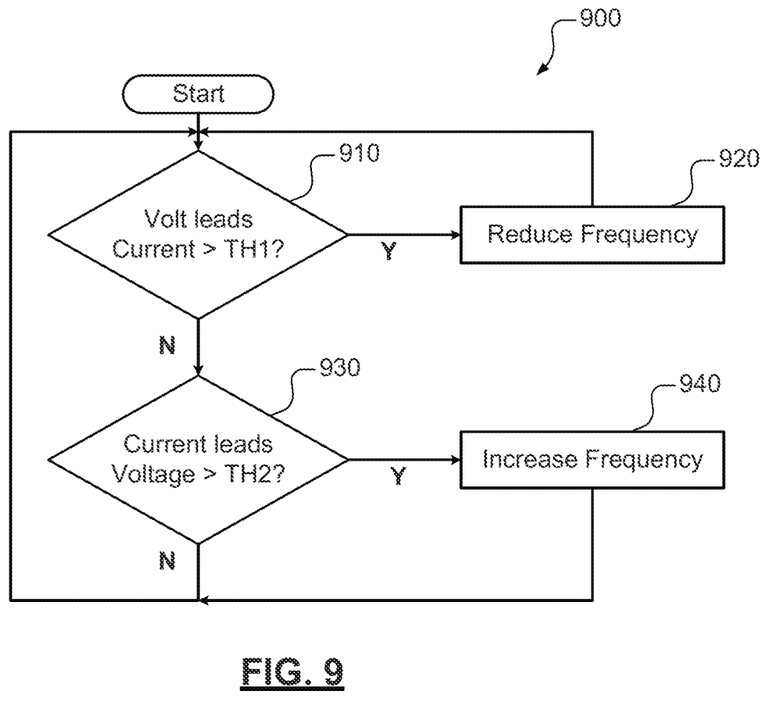
FIG. 9 is a flowchart of an example of a method for protecting switches in the direct drive circuit based on load resistance according to the present disclosure.

Referring now to FIG. 9, a method 900 for protecting switches of a direct drive circuit for a substrate processing system is shown. At 914, the method determines whether the direct drive circuit is on and supplying RF power. If false, the method returns to 914. When 914 is true, the method continues with 918 and monitors load voltage and load current. In some examples, the load voltage and load current is monitored using a VI probe. At 922, load resistance is calculated based on the load voltage and load current. At 926, the load resistance is compared to a predetermined resistance threshold $R_{th}$. If the load resistance is less than the predetermined resistance threshold $R_{th}$, the method reduces RF power and/or RF current of the direct drive circuit to protect the switches at 932.

At 938, the method determines whether a timer is on. If 938 is false, the timer is turned on at 948. At 942, a value of the timer is compared to a predetermined period $t_{TH}$. If the timer value is less than the predetermined period $t_{TH3}$, the method continues at 914. If the timer value is greater than or equal to the predetermined period $t_{TH3}$, the method continues at 946 and shuts off the direct drive circuit. In some examples, an error message is sent and/or an alarm is triggered.

Figure 10:
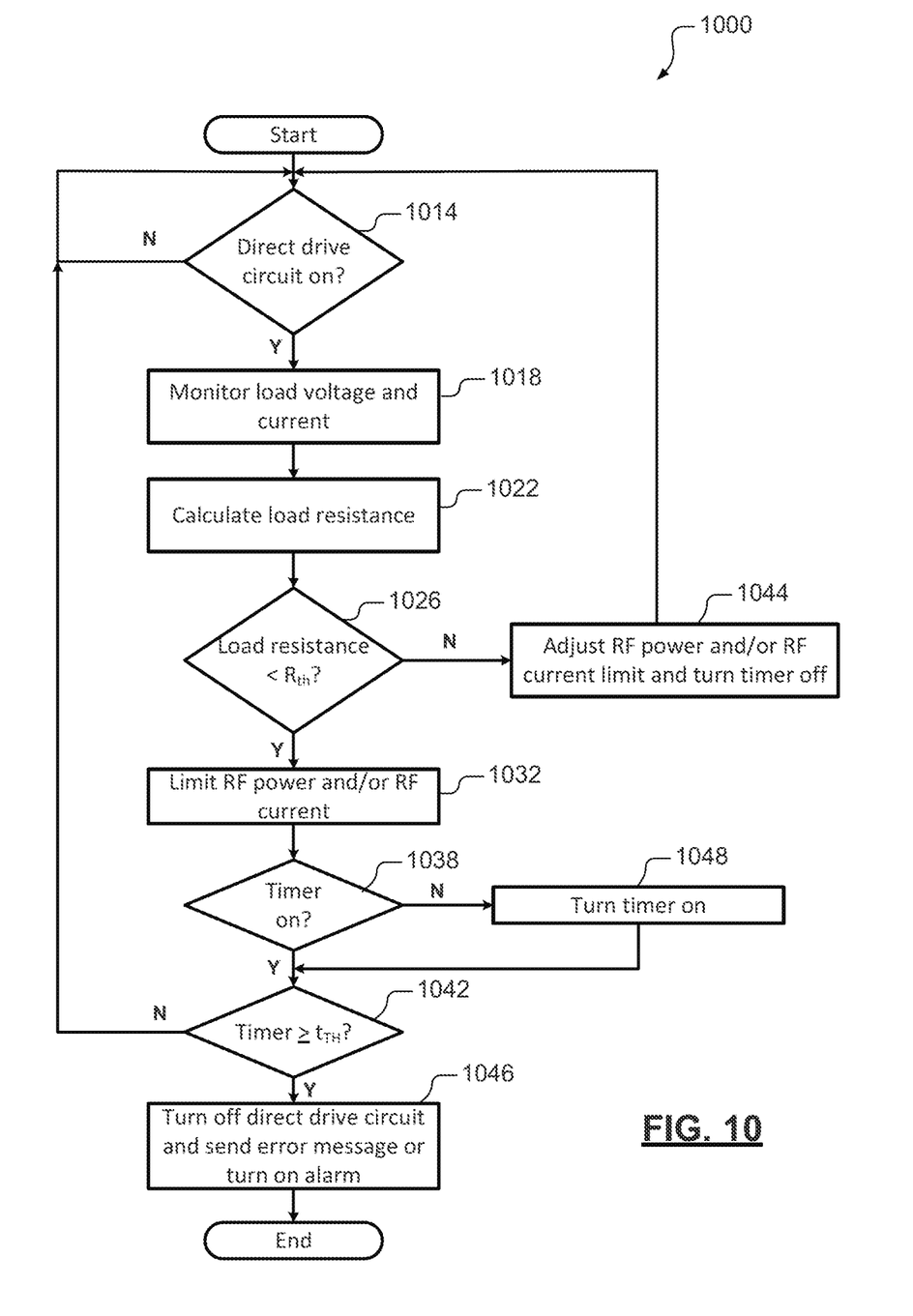
FIG. 10 is a flowchart of an example of a method for protecting switches in the direct drive circuit based on load resistance according to the present disclosure.

Referring now to FIG. 10, instead of reducing RF power and/or RF current limits, the RF power and/or RF current limits can be increased at 1010 for a predetermined period $t_{TH4}$ at 1014 to attempt to strike plasma. If plasma is struck, the resistance measured by the VI probe also generally increases. If plasma is not struck within the predetermined period $t_{TH4}$, then the direct drive circuit is shut down as described above.

While an example is set forth below for illustration purposes, other parameters can be used. For example when using maximum power and dissipation to protect the switches, maximum power at 2 MHz may be set to 6 kW and maximum power at 13 MHz may be set to 3 kW. Maximum RF current at 2 MHz may be set to 150 $A_{rms}$ (+15% headroom (or 172.5 $A_{rms}$) may be used for transients having a duration from 0.05 seconds to 2 seconds). Maximum RF current at 13 MHz may be set to 90 $A_{rms}$ (+15% headroom (or 103.5 $A_{rms}$) for transients having a duration from 0.05 seconds to 2 seconds). Corresponding dissipation limits at 2 MHz and 13 MHz are 1500 W and 1200 W, respectively. When these limits were used, switch failures still occurred. As a result, the limits were reduced, which unacceptably reduced the operating window.

As discussed above, problems may arise when the RF direct drive circuit is operating in a power mode with non-plasma conditions. At 2 MHz, internal resistance may be equal to 16.25 mΩ for a 4 channel design and the switch may have a drain to source resistance $R_{DS}$(On) equal to 65 mΩ. At 13 MHz, internal resistance may be equal to 60 mΩ for a 4 channel design and the switches may have a drain to source resistance $R_{DS}$(On) of 240 mΩ.

A typical non-plasma load at 2 MHz is 5 mΩ. A typical plasma load at 13 MHz is 70 mΩ. RF power efficiency in non-plasma conditions is quite low (without counting any of other internal stray losses). For example at 2 MHz, the efficiency is 5/(5+16.25)=23.53%. At 13 MHz, the efficiency is 70/(70+60)=53.85%. Rough estimates of max internal RF power consumption on power switches without counting any of other internal strays switching losses are as follows. At 2 MHz, $I^2_{2\ MHz}R_{2\ MHz}=110^2*0.01625=196.625$ (W). At 13 MHz, $I^2_{13\ MHz}R_{13\ MHz}=90^2*0.06=486$ (W).

Minimum load resistance limits for protection purpose are set higher than nominal non-plasma load resistances. Typical non-plasma load resistances at 2 MHz are equal to about 5 mΩ (maximum RF power with maximum RF current of 110 $A_{rms}$=60.5 W). Typical non-plasma load resistances at 13 MHz are equal to about 70 mΩ (maximum RF power with maximum RF current of 90 $A_{rms}$=567 W).

Load resistances are monitored when RF is turned on. When minimum load resistances are detected during normal operation, the switch protection module turns off RF output power and/or lowers the output power to below safe limits. For example, scaling factors $K_2$ and $K_{13}$ can be used (i.e., $K_2*60.5\ W_{2\ MHz}$ and $K_{13}*567\ W_{13\ MHz}$ can be used where $K_2$ and $K_{13}$ are configurable parameters between 0 and 1).

When minimum load resistances are detected during ignition or process step transitions, the switch protection module stops RF output power regulation, if running in power mode, and reduces or keeps DC rail to the level that is low enough so that RF currents stay within their safe limits (i.e., $K_2*110\ A_{2\ MHz}$ and $K_{13}*90\ A_{13\ MHz}$, respectively, where $K_2$ and $K_{13}$ are configurable parameter between 0 and 1).

If this condition lasts more than a predetermined period, the switch protection module shuts RF power off and sends alarm. In some examples, the predetermined period is in a range from 5 milliseconds to 1 second.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A direct drive circuit for providing RF power to a component of a processing chamber associated with a substrate processing system, comprising:
   the direct drive circuit including a switch and configured to supply said RF power to the component;
   a switch protection module configured to:
      monitor a load current and a load voltage in the processing chamber;
      calculate load resistance based on the load current and the load voltage;
      compare the load resistance to a first predetermined load resistance; and
      adjust at least one of an RF power limit and an RF current limit of the direct drive circuit based on the comparison;
   wherein the first predetermined load resistance is selected based on a resistance during at least one non-plasma condition.

2. The direct drive circuit of claim 1, further comprising a voltage/current (VI) probe arranged in the processing chamber and configured to generate the load current and load voltage.

3. The direct drive circuit of claim 1, wherein the at least one non-plasma condition corresponds to plasma failing to ignite.

4. The direct drive circuit of claim 1, wherein the at least one non-plasma condition corresponds to plasma dropping out after process gas flow to the process chamber is turned off.

5. The direct drive circuit of claim 1, wherein the switch protection module reduces the at least one of the RF power limit and the RF current limit of the direct drive circuit in response to the load resistance being less than or equal to the first predetermined load resistance.

6. The direct drive circuit of claim 5, wherein the switch protection module is configured to shut down the direct drive circuit in response to the load resistance being less than or equal to the first predetermined load resistance for a period greater than a predetermined period.

7. The direct drive circuit of claim 1, wherein the switch protection module increases the at least one of the RF power limit and the RF current limit of the direct drive circuit in response to the load resistance being less than or equal to the first predetermined load resistance.

8. The direct drive circuit of claim 7, wherein the switch protection module is configured to shut down the direct drive circuit in response to the load resistance being less than or equal to the first predetermined load resistance for a period greater than a predetermined period.

9. The direct drive circuit of claim 1, wherein:
   the switch protection module selects at least one of a first RF power limit and a first RF current limit of the direct drive circuit in response to the load resistance being less than or equal to the first predetermined load resistance and at least one of a second RF power limit and a second RF current limit of the direct drive circuit in response to the load resistance being greater than the first predetermined load resistance,
   the at least one of a first RF power limit and the first RF current limit of the direct drive circuit is less than the at least one of the second RF power limit and the second RF current limit of the direct drive circuit, respectively, and
   the switch protection module is configured to shut down the direct drive circuit in response to the load resistance being less than or equal to the first predetermined load resistance for a period greater than a predetermined period.

10. The direct drive circuit of claim 1, wherein:
   the switch protection module selects at least one of a first RF power limit and a first RF current limit of the direct drive circuit in response to the load resistance being less than or equal to the first predetermined load resistance and at least one of a second RF power limit and a second RF current limit of the direct drive circuit in response to the load resistance being greater than the first predetermined load resistance, the at least one of a first RF power limit and the first RF current limit of the direct drive circuit is greater than the at least one of the second RF power limit and the second RF current limit of the direct drive circuit, respectively, and the switch protection module is configured to shut down the direct drive circuit in response to the load resistance being less than or equal to the first predetermined load resistance for a period greater than a predetermined period.

11. The direct drive circuit of claim 1, wherein the switch protection module is configured to shut down the direct drive circuit in response to the load resistance being less than or equal to the first predetermined load resistance for a period greater than a predetermined period.

12. The direct drive circuit of claim 1, wherein the direct drive circuit includes:
a clock generator to generate a clock signal at a first frequency;
a gate driver to receive the clock signal;
a bridge circuit including:
a first switch with a control terminal connected to the gate driver, a first terminal and a second terminal; and
a second switch with a control terminal connected to the gate driver, a first terminal connected to the second terminal of the first switch and an output node, and a second terminal.

13. The direct drive circuit of claim 12, further comprising:
a current sensor to sense current at the output node and to generate a current signal;
a voltage sensor to sense voltage at the output node and to generate a voltage signal; and
a controller including:
a phase offset calculating module to calculate a phase offset between the voltage signal and the current signal; and
a clock adjusting module to adjust the first frequency based on the phase offset.

14. The direct drive circuit of claim 13, wherein the component comprises a coil arranged outside of the processing chamber.

15. A method for providing RF power to a component of a processing chamber associated with a substrate processing system, comprising:
supplying said RF power to the component using a direct drive circuit including a switch;
monitoring a load current and a load voltage in the processing chamber;
calculating load resistance based on the load current and the load voltage;
comparing the load resistance to a first predetermined load resistance; and
adjusting at least one of an RF power limit and an RF current limit of the direct drive circuit based on the comparison;
wherein the first predetermined load resistance is selected based on a resistance during at least one non-plasma condition.

16. The method of claim 15, further comprising arranging a voltage/current (VI) probe in the processing chamber and generating the load current and load voltage using the VI probe.

17. The method of claim 15, wherein the at least one non-plasma condition corresponds to plasma failing to ignite.

18. The method of claim 15, wherein the at least one non-plasma condition corresponds to plasma dropping out after process gas flow to the process chamber is turned off.

19. The method of claim 15, further comprising reducing the at least one of the RF power limit and the RF current limit of the direct drive circuit in response to the load resistance being less than or equal to the first predetermined load resistance.

20. The method of claim 19, further comprising shutting down the direct drive circuit in response to the load resistance being less than or equal to the first predetermined load resistance for a period greater than a predetermined period.

21. The method of claim 15, further comprising increasing the at least one of the RF power limit and the RF current limit of the direct drive circuit in response to the load resistance being less than or equal to the first predetermined load resistance.

22. The method of claim 21, further comprising shutting down the direct drive circuit if the load resistance is less than the first predetermined load resistance for a period greater than a predetermined period.

23. The method of claim 15, further comprising:
selecting at least one of a first RF power limit and a first RF current limit of the direct drive circuit in response to the load resistance being less than or equal to the first predetermined load resistance and at least one of a second RF power limit and a second RF current limit of the direct drive circuit in response the load resistance being greater than the first predetermined load resistance,
wherein the at least one of a first RF power limit and the first RF current limit of the direct drive circuit is less than the at least one of the second RF power limit and the second RF current limit of the direct drive circuit, respectively; and
shutting down the direct drive circuit in response to the load resistance being less than the first predetermined load resistance for a period greater than a predetermined period.

24. The method of claim 15, further comprising:
selecting at least one of a first RF power limit and a first RF current limit of the direct drive circuit in response to the load resistance being less than or equal to the first predetermined load resistance and at least one of a second RF power limit and a second RF current limit of the direct drive circuit in response to the load resistance being greater than the first predetermined load resistance,
wherein the at least one of a first RF power limit and the first RF current limit of the direct drive circuit is greater than the at least one of the second RF power limit and the second RF current limit of the direct drive circuit, respectively; and
shutting down the direct drive circuit in response to the load resistance being less than or equal to the first predetermined load resistance for a period greater than a predetermined period.

* * * * *